United States Patent [19]

van Beijnen

[11] 3,926,683

[45] Dec. 16, 1975

[54] METHOD OF MANUFACTURING SUPERCONDUCTORS OF β-TUNGSTEN STRUCTURE

[75] Inventor: Christianus Antonius Maria van Beijnen, Alkmaar, Netherlands

[73] Assignee: Reactor Centrum Nederland (Stichting), The Hague, Netherlands

[22] Filed: Mar. 22, 1974

[21] Appl. No.: 453,952

[30] Foreign Application Priority Data

Apr. 9, 1973 Netherlands ...................... 7304947

[52] U.S. Cl. ............................. 148/11.5 R; 29/599

[51] Int. Cl.[2] ......................................... H01L 39/02

[58] Field of Search .................. 148/11.5 R; 29/599

[56] References Cited

UNITED STATES PATENTS

| | | | |
|---|---|---|---|
| 3,541,680 | 11/1970 | Verrijp | 29/599 |
| 3,623,221 | 11/1971 | Morton et al. | 29/599 |
| 3,625,662 | 12/1971 | Roberts et al. | 29/599 |

*Primary Examiner*—W. Stallard
*Attorney, Agent, or Firm*—Stewart and Kolasch, Ltd.

[57] ABSTRACT

A Method of manufacturing a superconductor consisting of different materials by introducing into material of an element or an alloy at least one element of another group or a compound, whereupon the diameter of the assembly, if desired, is reduced and subsequently a superconductive layer of said elements is formed by thermal treatment.

18 Claims, No Drawings

METHOD OF MANUFACTURING SUPERCONDUCTORS OF β-TUNGSTEN STRUCTURE

BACKGROUND AND SUMMARY OF THE INVENTION

The present invention relates to a method of manufacturing a superconductor assembly comprising at least one wire made from different materials.

Superconductive wires are known as can be seen by referring to the article: "Superconducting Properties of multi-filamentary $V_3Ga$ Wires" by M. Suenaga and W. B. Sampson in "Applied Physics Letters", Vol. 28, member 12, pages 584 to 586.

This superconductor assembly is manufactured by inserting vanadium into a hole in a piece of copper-gallium alloy and causing the gallium, by thermal treatment, to diffuse across the copper to the vanadium. The superconductive material $V_3Ga$ is then formed in the boundary layer of the vanadium. Superconduction occurs below a given temperature. However, it may occur that due to an excessively high temperature, or other factors, the superconduction gets locally lost, temporarily. In this case, the ambient copper layer has to conduct the current and the dissipation of the developed heat.

However, disadvantage of the method described above is that the superconducting layer is formed with the aid of material from the piece of copper so that a given quantity of gallium is always left as an impurity in the copper, which is consequently less capable of fulfilling its aforesaid functions.

An object of the present invention is to provide a superconductor assembly which is surrounded by a conductor whose composition does not vary during manufacture. This is achieved by providing a hole in a bar of conductive metal, by inserting in said hole a first element of group VB of the Periodic Table and incorporating in said first element, a second element or an alloy or a compound of an element selected from the groups IIIA, or IVA of the Periodic System of the "Handbook of Chemistry and Physics", Edition 35, 1953/54. The superconductor assembly can be deformed, if desired, to a smaller diameter followed by thermal treatment to produce a superconducting boundary layer of these elements or their alloys. Because the superconducting layer is made without the aid of material from the surrounding conductor, the choice of said conductor may be made independently of the superconducting layer. During the thermal treatment the second element diffuses across the first element and the superconducting boundary layer is formed without change of the composition of the conductor.

The thermal treatment may be carried out for 50 to 150 hours at a temperature of 550° to 900°C. Since aluminium has a melting point of about 660°C, this metal may, therefore, serve as a conductor in the method according to the invention.

In one embodiment the conductor may be made of copper, the first element may be vanadium and the second element may be a gallium compound. The compound may be formed by a mixture of about 22.6% by weight of vanadium and 77.4% by weight of gallium. This mixture may be heated in vacuum at about 700°C, resulting in the exothermic reaction $2V + 5Ga \rightarrow V_2Ga_5$. After pulverisation of the $V_2Ga_5$ and, as the case may be, the addition of copper powder serving as a catalyst in a ratio of 0.1 to 10% by weight of the mixture, the resultant mixture is introduced into the space in the vanadium. The powder in the vanadium is densified as far as possible. After the deformation of the assembly to a smaller diameter, the thermal treatment is carried out for 150 hours at 600°C. This results in the reaction: $13V + V_2Ga_5 \rightarrow 5V_3Ga$. The 13 vanadium atoms required for each $V_2Ga_5$ molecule are provided by the vanadium tube. With respect to the quantity of the mixture of $V_2Ga_5$ the thickness of the vanadium is preferably chosen such that finally all the vanadium is consumed and the $V_3Ga$ as a boundary layer comes into direct contact with the matrix of pure copper. If this were not the case, a barrier would be formed between the superconducting $V_3Ga$ and the copper so that in the event of a failure of the superconduction the copper has to conduct the current across this barrier operating as an additional resistance. This measure provides a layer of $V_3Ga$ of dense structure. Under certain conditions, for example, in conducting pulsatory currents, a given quantity of residual vanadium is not undesirable. By a choice of the aforesaid ratios the final state can be accurately controlled.

It should be noted that the formation of $V_3Ga$ is known from German Pat. application No. 1,234,993. However, in this case the reaction is carried out at a temperature between 1113° and 1400°C in contrast to the present invention, where the reaction takes place at a temperature between 550° and 900°C. This is important because this temperature range permits employing conductors having a melting point of 600°C and higher. As an alternative, the copper powder may be first dissolved in the gallium, which is mixed with the vanadium powder.

With a multi-filamentary superconductor a formed wire is reduced in diameter prior to the thermal treatment. In this case the formed wires are inserted into holes in bars of pure copper and, as the case may be, the diameter of the assembly is again reduced. The composition of the gallium compound of some of the wires may be chosen different from that of the other wires.

It will be obvious that the concept of the present invention also applies to superconductors of other compositions, for example $Nb_3Sn$, $Nb_3Al$, $Nb_3Ga$, $Nb_{3.67}(Al_{0.73}Ge_{0.27})$ and $V_3Si$. Suitable conductors for this purpose are also metals and their alloys such as aluminium, silver and the like.

What I claim is:

1. A method of manufacturing a superconductor comprising at least one wire constructed from different materials which comprises providing a hole in a bar of conductive metal, inserting a first component selected from the elements of Group VB of the Periodic Table into said hole, introducing into said first component a second component consisting essentially of an alloy or a compound of said Group VB element and an element selected from the group consisting of Group IIIA and Group IVA of the Periodic Table, and thermally treating said wire to produce a superconductor having a superconductive boundary layer.

2. The method of claim 1, wherein the thermal treatment is carried out for 50–150 hours at a temperature of 550–900°C.

3. The method of claim 1, wherein the first component is vanadium and the second component is a compound of 22.6% by weight vanadium and 77.4% by weight gallium.

4. The method of claim 1, wherein the thermal treatment is carried out for 150 hours at a temperature of 600°C.

5. The method of claim 1, wherein the Group VB element in the first and second component are the same.

6. The method of claim 3, wherein the second component is formed by heating at about 700°C. which results in the reaction $2V + 5Ga \rightarrow V_2Ga_5$.

7. The method of claim 3, wherein the $V_2Ga_5$ is pulverized and mixed with copper powder prior to its incorporation into the vanadium.

8. The method of claim 7, wherein the copper is present in an amount of about 0.1 to 10% by weight of the mixture.

9. The method of claim 7, wherein the mixture of pulverized $V_2Ga_5$ and copper powder incorporated into the vanadium is densified.

10. The method of claim 3, wherein the quantity of vanadium is selected so that in the final state all of the vanadium is bonded in the form of $V_3Ga$.

11. The method of claim 1, wherein the superconducting boundary layer is $V_3Ga$.

12. The method of claim 1, wherein the diameter of the wire is reduced before the thermal treatment.

13. The method of claim 1, wherein during the thermal treatment the second component diffuses across the first component and the superconducting boundary layer is formed without a change in the composition of the conductor.

14. The method of claim 3, wherein copper powder is added to the gallium.

15. The method of claim 1, wherein the superconductor comprises a plurality of wires and prior to the thermal treatment the wires are shaped to the desired final dimensions.

16. The method of claim 15, wherein the amount of the gallium compound in some of the wires differs from that in other wires.

17. The method of claim 1, wherein the superconductor is selected from the Group consisting of $Nb_3Sn$, $Nb_3Al$, $Nb_3Ga$, $Nb_{3.67}(Al_{0.73}Ge_{0.27})$ and $V_3Si$.

18. The method of claim 17, wherein the conductor is a metal or metal alloy selected from the group consisting of aluminum, copper and silver.

* * * * *